United States Patent
Rosser

(10) Patent No.: US 6,526,543 B1
(45) Date of Patent: Feb. 25, 2003

(54) METHOD, SYSTEM, AND COMPUTER PROGRAM PRODUCT FOR OPTIMIZING LOGIC DURING SYNTHESIS OF LOGIC DESIGNS

(75) Inventor: Thomas Edward Rosser, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/998,029

(22) Filed: Nov. 29, 2001

(51) Int. Cl.$^7$ .................. G06F 17/50; G06F 9/45
(52) U.S. Cl. ............................ 716/2; 716/6
(58) Field of Search ........................ 716/2, 6

(56) References Cited

U.S. PATENT DOCUMENTS

| | | | | |
|---|---|---|---|---|
| 4,924,430 A | * | 5/1990 | Zasio et al. ............ | 716/6 |
| 5,095,454 A | * | 3/1992 | Huang ................... | 703/19 |
| 5,365,463 A | * | 11/1994 | Donath et al. .......... | 703/19 |
| 5,475,607 A | * | 12/1995 | Apte et al. ............. | 716/10 |
| 5,508,937 A | * | 4/1996 | Abato et al. ........... | 716/6 |
| 5,581,473 A | * | 12/1996 | Rusu et al. ............. | 716/6 |
| 5,636,372 A | * | 6/1997 | Hathaway et al. ....... | 713/500 |
| 5,651,012 A | * | 7/1997 | Jones, Jr. .............. | 714/724 |
| 5,764,532 A | * | 6/1998 | Patel .................... | 716/9 |
| 5,778,216 A | * | 7/1998 | Venkatesh .............. | 713/503 |
| 5,883,808 A | * | 3/1999 | Kawarabayashi ........ | 716/2 |
| 5,923,564 A | * | 7/1999 | Jones, Jr. .............. | 716/6 |
| 6,023,568 A | * | 2/2000 | Segal ................... | 716/6 |
| 6,268,746 B1 | * | 7/2001 | Potter et al. ............ | 326/93 |
| 6,389,580 B1 | * | 5/2002 | Ozaki ................... | 716/6 |

OTHER PUBLICATIONS

T, Burks et al., Critical Paths in Circuits with Level Sensitive Latches, IEEE Transactions on Very Large Scale Integration Systems, col. 3, No. 2, pp. 273–291, Jun. 1995.*
T. Burks et al., Optimization of Critical Paths in Circuits with Level–Sensitive Latches, IEEE/ACM Conference on Computer Aided Design, pp. 468–473, May 1994.*

* cited by examiner

Primary Examiner—Matthew Smith
Assistant Examiner—A. M. Thompson
(74) Attorney, Agent, or Firm—Duke W. Yee; Mark E. McBurney; Lisa L. B. Yociss

(57) ABSTRACT

A method, system, and computer program product are disclosed for optimizing logic during synthesis of a logic design. A first timing path within the logic design is identified. The first timing path has first logic to be optimized in order to improve timing in the first timing path. A determination is then made regarding whether an input node to the first timing path is a particular device. In response to the input node being the particular device, a determination is made regarding whether optimizing second logic included in a second timing path having the particular device as its output node will improve timing in the first timing path. In response to a determination that optimizing the second logic will improve timing in the first timing path, both the second logic and the first logic are selected to be optimized.

20 Claims, 2 Drawing Sheets

METHOD, SYSTEM, AND COMPUTER PROGRAM PRODUCT FOR OPTIMIZING LOGIC DURING SYNTHESIS OF LOGIC DESIGNS

TECHNICAL FIELD

The present invention relates generally to the field of integrated circuit design, and, more specifically, to the field of logic synthesis of electronic circuit designs. Yet more specifically, the present invention relates to a method, system, and computer program product for optimizing logic during synthesis of logic designs.

DESCRIPTION OF RELATED ART

Microelectronic integrated circuits consist of a large number of electronic components that are fabricated by layering several different materials on a silicon base or wafer. The design of an integrated circuit transforms a circuit description into a geometric description which is known as a layout. The process of converting the functional specifications of an electronic circuit into a layout is called the physical design.

The objective of physical design is to determine an optimal arrangement of devices in a plane or in a three dimensional space, and an efficient interconnection or routing scheme between the devices to obtain the desired functionality.

An integrated circuit chip (hereafter referred to as an "IC" or a "chip") comprises cells and connections between the cells formed on a surface of a semiconductor substrate. The IC may include a large number of cells and require complex connections between the cells.

A cell is a group of one or more circuit elements such as transistors, capacitors, and other basic circuit elements grouped to perform a function. Each of the cells of an IC may have one or more pins, each of which, in turn, may be connected to one or more other pins of the IC by wires. The wires connecting the pins of the IC are also formed on the surface of the chip.

A net is a set of two or more pins which must be connected. Because a typical chip has thousands, tens of thousands, or hundreds of thousands of pins which must be connected in various combinations, the chip also includes definitions of thousands, tens of thousands, or hundreds of thousands of nets, or sets of pins. All the pins of a net must be connected. The number of the nets for a chip is typically in the same order as the order of the number of cells on that chip. Commonly, a majority of the nets include only two pins to be connected; however, many nets comprise three or more pins.

The input to the physical design problem is a circuit diagram, and the output is the layout of the circuit. This is accomplished in several stages including partitioning, floor planning, placement, routing and compaction.

In trying to improve a logic design during synthesis, it is important to fix the most critical timing path. Therefore, synthesis tools first attempt to optimize the logic in the timing path having the worst timing problem. Once the timing through this timing path is improved, the tool then attempts to fix the next worst timing problem.

A timing path is defined as being the path between an input and an output, an input and a latch, a latch and an output, and a first latch and a second latch. The logic in the timing path having the worst timing problem is selected to be optimized.

The latches in the logic may be implemented using transparent latches. For transparent latches, the data appearing on the input side of the transparent latch flushes through to the output side of the latch while the clock is on.

The synthesis tool uses one or both of two approaches to fix the timing problem. One approach is to reduce the amount of logic, and the other approach is to go through the existing logic faster. Neither of these approaches recognize the special situation of the transparent latch, where it is possible to start the signal into the logic sooner by getting it to the input of the transparent latch sooner.

Therefore, a need exists for a method, system, and product for optimizing logic during synthesis of logic designs by selecting logic in multiple timing paths when the timing path having the worst timing problem includes a transparent latch as its input node.

SUMMARY OF THE INVENTION

A method, system, and computer program product are disclosed for optimizing logic during synthesis of a logic design. A first timing path within the logic design is identified. The first timing path has first logic to be optimized in order to improve timing in the first timing path. A determination is then made regarding whether an input node to the first timing path is a particular device. In response to the input node being the particular device, a determination is made regarding whether optimizing second logic included in a second timing path having the particular device as its output node will improve timing in the first timing path. In response to a determination that optimizing the second logic will improve timing in the first timing path, both the second logic and the first logic are selected to be optimized.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

A preferred embodiment of the present invention and its advantages are better understood by referring to the figures, like numerals being used for like and corresponding parts of the accompanying figures.

The present invention is a method, system, and computer product for optimizing logic during logic synthesis. A first timing path having the largest negative slack, i.e. the worst timing problem, is identified. A determination is first made as to whether the input node to this first timing path is a transparent latch. If the input node to this timing path is a transparent latch, a determination is made as to whether an improvement of the timing through a second timing path having this transparent latch as its output node would improve the timing in the first timing path. If a determination is made that improving the timing through the second timing path would result in an improvement in timing in the first timing path, the logic in both timing paths are selected to be optimized.

A determination is made that improving the timing through the second timing path would result in an improvement in timing in the first timing path when the second timing path has a negative slack.

Figure 1:
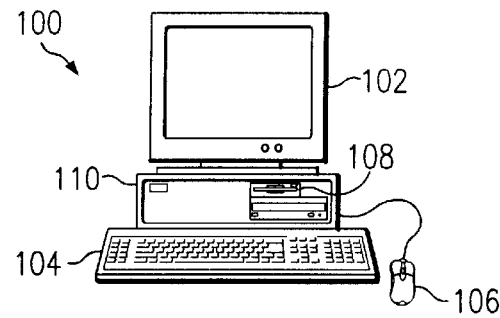
FIG. 1 is a pictorial representation which depicts a data processing system in which the present invention may be implemented in accordance with a preferred embodiment of the present invention.

With reference now to the figures and in particular with reference to FIG. 1, a pictorial representation of a data processing system in which the present invention may be implemented is depicted in accordance with a preferred embodiment of the present invention. A computer 100 is depicted which includes a system unit 102, a video display terminal 104, a keyboard 106, storage devices 108, which may include floppy drives and other types of permanent and removable storage media, and mouse 110. Additional input devices may be included with personal computer 100, such as, for example, a joystick, touchpad, touch screen, trackball, microphone, and the like. Computer 100 can be implemented using any suitable computer, such as an IBM RS/6000 computer or IntelliStation computer, which are products of International Business Machines Corporation, located in Armonk, N.Y. Although the depicted representation shows a computer, other embodiments of the present invention may be implemented in other types of data processing systems, such as a network computer. Computer 100 also preferably includes a graphical user interface that may be implemented by means of systems software residing in computer readable media in operation within computer 100.

Figure 2:
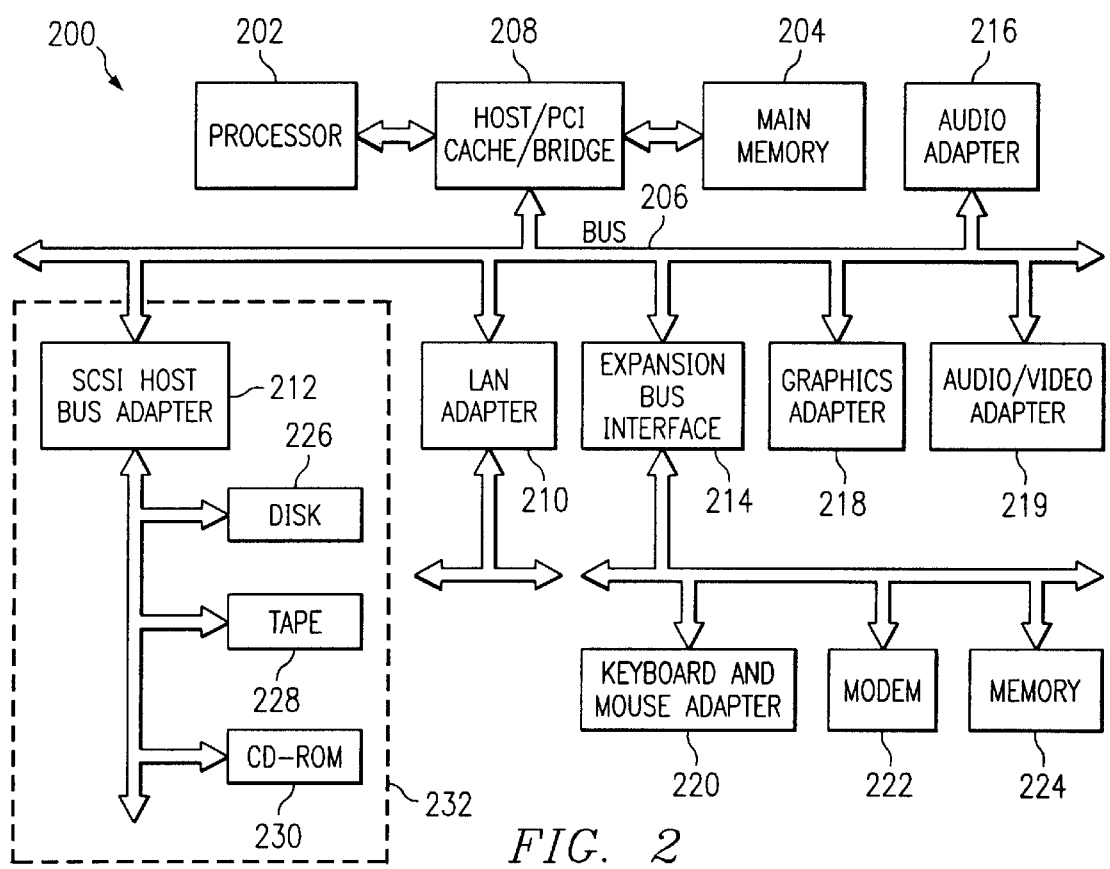
FIG. 2 is a block diagram of a data processing system in which the present invention may be implemented in accordance with a preferred embodiment of the present invention.

With reference now to FIG. 2, a block diagram of a data processing system is shown in which the present invention may be implemented. Data processing system 200 is an example of a computer, such as computer 100 in FIG. 1, in which code or instructions implementing the processes of the present invention may be located. Data processing system 200 employs a peripheral component interconnect (PCI) local bus architecture. Although the depicted example employs a PCI bus, other bus architectures such as Accelerated Graphics Port (AGP) and Industry Standard Architecture (ISA) may be used. Processor 202 and main memory 204 are connected to PCI local bus 206 through PCI bridge 208. PCI bridge 208 also may include an integrated memory controller and cache memory for processor 202. Additional connections to PCI local bus 206 may be made through direct component interconnection or through add-in boards. In the depicted example, local area network (LAN) adapter 210, small computer system interface SCSI host bus adapter 212, and expansion bus interface 214 are connected to PCI local bus 206 by direct component connection. In contrast, audio adapter 216, graphics adapter 218, and audio/video adapter 219 are connected to PCI local bus 206 by add-in boards inserted into expansion slots. Expansion bus interface 214 provides a connection for a keyboard and mouse adapter 220, modem 222, and additional memory 224. SCSI host bus adapter 212 provides a connection for hard disk drive 226, tape drive 228, and CD-ROM drive 230. Typical PCI local bus implementations will support three or four PCI expansion slots or add-in connectors.

An operating system runs on processor 202 and is used to coordinate and provide control of various components within data processing system 200 in FIG. 2. The operating system may be a commercially available operating system such as Windows 2000, which is available from Microsoft Corporation. An object oriented programming system such as Java may run in conjunction with the operating system and provides calls to the operating system from Java programs or applications executing on data processing system 200. "Java" is a trademark of Sun Microsystems, Inc. Instructions for the operating system, the object-oriented programming system, and applications or programs are located on storage devices, such as hard disk drive 226, and may be loaded into main memory 204 for execution by processor 202.

Those of ordinary skill in the art will appreciate that the hardware in FIG. 2 may vary depending on the implementation. Other internal hardware or peripheral devices, such as flash ROM (or equivalent nonvolatile memory) or optical disk drives and the like, may be used in addition to or in place of the hardware depicted in FIG. 2. Also, the processes of the present invention may be applied to a multiprocessor data processing system.

For example, data processing system 200, if optionally configured as a network computer, may not include SCSI host bus adapter 212, hard disk drive 226, tape drive 228, and CD-ROM 230, as noted by dotted line 232 in FIG. 2 denoting optional inclusion. In that case, the computer, to be properly called a client computer, must include some type of network communication interface, such as LAN adapter 210, modem 222, or the like. As another example, data processing system 200 may be a stand-alone system configured to be bootable without relying on some type of network communication interface, whether or not data processing system 200 comprises some type of network communication interface. As a further example, data processing system 200 may be a personal digital assistant (PDA), which is configured with ROM and/or flash ROM to provide non-volatile memory for storing operating system files and/or user-generated data.

The depicted example in FIG. 2 and above-described examples are not meant to imply architectural limitations. For example, data processing system 200 also may be a notebook computer or hand held computer in addition to taking the form of a PDA. Data processing system 200 also may be a kiosk or a Web appliance.

The processes of the present invention are performed by processor 202 using computer implemented instructions, which may be located in a memory such as, for example, main memory 204, memory 224, or in one or more peripheral devices 226–230.

Figure 3:
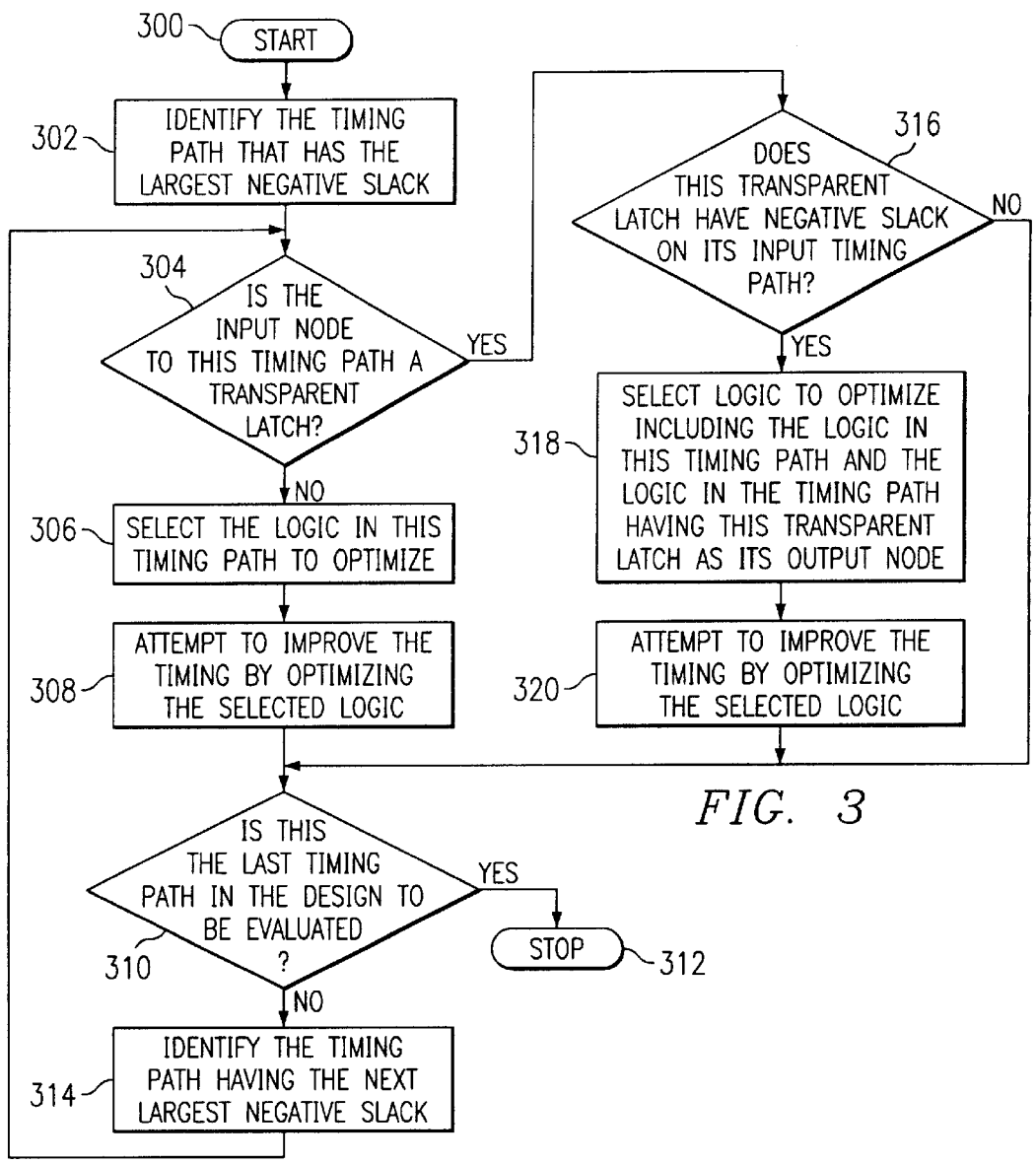
FIG. 3 is a high level flow chart which depicts selecting to be optimized the logic in a timing path which has a transparent latch as the input node to the timing path and including within the selected logic the logic in the timing path having that transparent latch as its output node in accordance with the present invention.

FIG. 3 is a high level flow chart which depicts selecting to be optimized the logic in a timing path which has a transparent latch as the input node to the timing path and including within the selected logic the logic in the timing path having that transparent latch as its output node in accordance with the present invention. The process starts as depicted by block 300 and thereafter passes to block 302 which illustrates identifying the timing path that has the largest negative slack. Next, block 304 depicts a determination of whether or not the input node to this timing path is a transparent latch. If a determination is made that the input node to this timing path is not a transparent latch, the process passes to block 306 which illustrates selecting the logic in the timing path to optimize. The process then passes to block 308 which depicts attempting to improve the timing through this selected logic by optimizing the selected logic. Next, block 310 illustrates a determination of whether or not this is the last timing path in the logic design to be evaluated. If a determination is made that this is the last timing path to be evaluated, the process terminates as depicted by block 312. Referring again to block 310, if a determination is made that this is not the last timing path to be evaluated, the process passes to block 314 which depicts identifying the timing path having the next largest negative slack. The process then passes back to block 304.

Referring again to block 304, if a determination is made that the input node to this timing path is a transparent latch, the process passes to block 316 which illustrates a determination of whether or not this transparent latch has negative slack on its input timing path. If a determination is made that this transparent latch does not have negative slack on its input timing path, the process passes back to block 310.

Referring again to block 316, if a determination is made that this transparent latch does have negative slack on its input timing path, the process passes to block 318. Block 318, then, depicts selecting logic to optimize. The selected logic includes the logic in this timing path, having the transparent latch as the input node, and the logic in the timing path having this transparent latch as its output node. Thereafter, block 320 illustrates attempting to improve the timing through the selected logic by optimizing the selected logic. Thus, the logic in two timing paths, the path having the transparent latch as its input node and the path having the transparent latch as its output node, is selected and optimized generally concurrently. The process then passes back to block 310.

Figure 4:
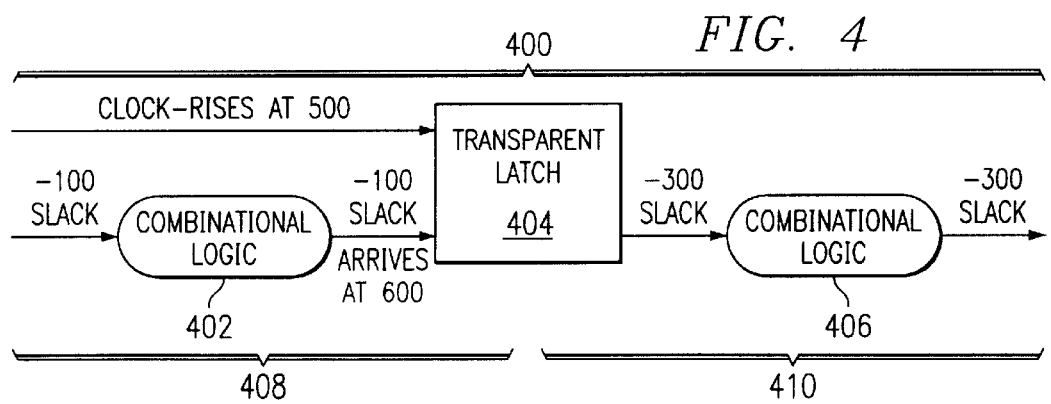
FIG. 4 illustrates a logic design having two timing paths where the logic in both timing paths are selected to be optimized in accordance with the present invention.

FIG. 4 illustrates a logic design having two timing paths where the logic in both timing paths are selected to be optimized in accordance with the present invention. A logic design 400 includes combinational logic 402, a transparent latch 404, and combinational logic 406. Thus, two timing paths are depicted, i.e. timing path 408 and timing path 410. Timing path 408 extends from an input to transparent latch 404. Timing path 410 extends from transparent latch 404 to an output. As depicted, timing path 410 has a slack of −300 psec and timing path 408 has a slack of −100 psec. Assuming timing path 410 has the largest negative slack, logic 406 in timing path 410 is selected to be optimized. According to the present invention, logic 402 in timing path 408 is also selected to be optimized along with logic 406 because the input node to timing path 410 is a transparent latch, i.e. transparent latch 404 that has negative slack on its input.

If logic 402 is optimized such that the signal arrives at transparent latch 404 100 psec earlier, the improvement will translate to timing path 410 such that the −300 psec slack will be reduced to −200 psec.

Improving the timing in timing path 408 will result in an improvement in the timing in timing path 410. Therefore, both logic 402 and logic 406 are selected to be optimized generally concurrently.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method in a data processing system for optimizing logic during synthesis of a logic design, said method comprising the steps of:

selecting a first timing path within said logic design having first logic to be optimized to improve timing in said first timing path;

determining whether an input node to said first timing path is a particular device;

in response to said input node being said particular device, determining whether optimizing second logic included in a second timing path having said particular device as its output node will improve timing in said first timing path;

in response to a determination that optimizing said second logic will improve timing in said first timing path, selecting said second timing path;

combining said first and second timing paths into a single selected timing path; and optimizing said single selected timing path by optimizing said first and second logic concurrently.

2. The method according to claim 1, wherein said step of determining whether an input node to said first timing path is a particular device further comprises the step of determining whether an input node to said first timing path is a transparent latch.

3. The method according to claim 1, wherein said step of selecting a first timing path within said logic design having first logic to be optimized further comprises the step of selecting a first timing path within said logic design having a largest negative slack, and further including the step of selecting said second timing path, wherein said second timing path does not have the second largest negative slack.

4. The method according to claim 1, wherein the step of determining whether optimizing second logic included in a second timing path will improve timing in said first timing path further comprises the steps of:

determining whether a second timing path having said particular device as its output node has a negative slack; and in response to a determination that said second timing path has a negative slack, determining that optimizing second logic included in said second timing path will improve timing in said first timing path.

5. The method according to claim 1, further comprising the steps of:

selecting a first timing path within said logic design having a largest negative slack;

determining whether an input node to said first timing path is a transparent latch;

in response to said input node being said transparent latch, determining whether a second timing path having said transparent latch as its output node has a negative slack;

in response to a determination that said second timing path has a negative slack, determining that optimizing second logic included in said second timing path will improve timing in said first timing path;

in response to a determination that optimizing said second logic will improve timing in said first timing path, selecting both said second logic and said first logic; and optimizing said first and second logic concurrently.

6. The method according to claim 1, further comprising the steps of:

determining that said first timing path within said logic design has a negative slack; and determining that optimizing second logic included in a second timing path having said particular device as its output node will improve timing in said first timing path when optimizing second logic will reduce said negative slack of said first timing path.

7. The method according to claim 6, further comprising the steps of:

determining that said second timing path has a negative slack; and determining that optimizing second logic will reduce said negative slack of said first timing path when optimizing second logic will reduce said negative slack of said second timing path.

8. A data processing system for optimizing logic during synthesis of a logic design comprising:

means for selecting a first timing path within said logic design having first logic to be optimized to improve timing in said first timing path;

means for determining whether an input node to said first timing path is a particular device;

in response to said input node being said particular device, means for determining whether optimizing second logic included in a second timing path having said particular device as its output node will improve timing in said first timing path;

in response to a determination that optimizing said second logic will improve timing in said first timing path, means for selecting said second timing path;

means for combining said first and second timing paths into a single selected timing path; and means for optimizing said single selected timing path by optimizing said first and second logic concurrently.

9. The system according to claim 8, wherein said means for determining whether an input node to said first timing path is a particular device further comprises means for determining whether an input node to said first timing path is a transparent latch.

10. The system according to claim 8, wherein said means for selecting a first timing path within said logic design having first logic to be optimized further comprises means for selecting a first timing path within said logic design having a largest negative slack, and further including means for selecting said second timing path, wherein said second timing path does not have the second largest negative slack.

11. The system according to claim 8, wherein said means for determining whether optimizing second logic included in a second timing path will improve timing in said first timing path further comprises:

means for determining whether a second timing path having said particular device as its output node has a negative slack; and in response to a determination that said second timing path has a negative slack, means for determining that optimizing second logic included in said second timing path will improve timing in said first timing path.

12. The system according to claim 8, further comprising:

means for selecting a first timing path within said logic design having a largest negative slack;

means for determining whether an input node to said first timing path is a transparent latch;

in response to said input node being said transparent latch, means for determining whether a second timing path having said transparent latch as its output node has a negative slack;

in response to a determination that said second timing path has a negative slack, means for determining that optimizing second logic included in said second timing path will improve timing in said first timing path;

in response to a determination that optimizing said second logic will improve timing in said first timing path, means for selecting both said second logic and said first logic; and means for optimizing said first and second logic concurrently.

13. The system according to claim 8, further comprising:

means for determining that said first timing path within said logic design has a negative slack; and means for determining that optimizing second logic included in a second timing path having said particular device as its output node will improve timing in said first timing path when optimizing second logic will reduce said negative slack of said first timing path.

14. The system according to claim 13, further comprising:

means for determining that said second timing path has a negative slack; and means for determining that optimizing second logic will reduce said negative slack of said first timing path when optimizing second logic will reduce said negative slack of said second timing path.

15. A computer program product in a data processing system for optimizing logic during synthesis of a logic design, said computer program product comprising:

instruction means for selecting a first timing path within said logic design having first logic to be optimized to improve timing in said first timing path;

instruction means for determining whether an input node to said first timing path is a particular device;

in response to said input node being said particular device, instruction means for determining whether optimizing second logic included in a second timing path having said particular device as its output node will improve timing in said first timing path;

in response to a determination that optimizing said second logic will improve timing in said first timing path, instruction means for selecting said second timing path;

instruction means for combining said first and second timing paths into a single selected timing path; and instruction means for optimizing said single selected timing path by optimizing said first and second logic concurrently.

16. The product according to claim 15, wherein said instruction means for determining whether an input node to said first timing path is a particular device further comprises instruction means for determining whether an input node to said first timing path is a transparent latch.

17. The product according to claim 15, wherein said instruction means for selecting a first timing path within said logic design having first logic to be optimized further comprises instruction means for selecting a first timing path within said logic design having a largest negative slack, and further including instruction means for selecting said second timing path, wherein said second timing path does not have the second largest negative slack.

18. The product according to claim 15, wherein said instruction means for determining whether optimizing second logic included in a second timing path will improve timing in said first timing path further comprises:

instruction means for determining whether a second timing path having said particular device as its output node has a negative slack; and in response to a determination that said second timing path has a negative slack, instruction means for determining that optimizing second logic included in said second timing path will improve timing in said first timing path.

19. The product according to claim 15, further comprising:

instruction means for selecting a first timing path within said logic design having a largest negative slack;

instruction means for determining whether an input node to said first timing path is a transparent latch;

in response to said input node being said transparent latch, instruction means for determining whether a second timing path having said transparent latch as its output node has a negative slack;

in response to a determination that said second timing path has a negative slack, instruction means for determining that optimizing second logic included in said second timing path will improve timing in said first timing path;

in response to a determination that optimizing said second logic will improve timing in said first timing path, instruction means for selecting both said second logic and said first logic; and instruction means for optimizing said first and second logic concurrently.

20. The product according to claim 15, further comprising:

instruction means for determining that said first timing path within said logic design has a negative slack; and instruction means for determining that optimizing second logic included in a second timing path having said particular device as its output node will improve timing in said first timing path when optimizing second logic will reduce said negative slack of said first timing path.

* * * * *